(12) United States Patent
Ong et al.

(10) Patent No.: US 8,723,557 B2
(45) Date of Patent: May 13, 2014

(54) MULTI-SUPPLY SYMMETRIC DRIVER CIRCUIT AND TIMING METHOD (75) Inventors: Adrian E. Ong, Pleasanton, CA (US); Dmytro Apalkov, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 195 days.

(21) Appl. No.: 13/153,031

(22) Filed: Jun. 3, 2011

(65) Prior Publication Data
US 2012/0206167 A1   Aug. 16, 2012

Related U.S. Application Data (60) Provisional application No. 61/352,306, filed on Jun. 7, 2010.

(51) Int. Cl.
*H03K 3/00* (2006.01)

(52) U.S. Cl.
USPC .......................................................... 327/108

(58) Field of Classification Search
None
See application file for complete search history.

(56) References Cited

U.S. PATENT DOCUMENTS

| | | | |
|---|---|---|---|
| 6,421,293 B1 | 7/2002 | Candelier et al. | |
| 6,552,928 B1 | 4/2003 | Qi et al. | |
| 6,590,825 B2 | 7/2003 | Tran et al. | |
| 6,825,698 B2 * | 11/2004 | Wang et al. | 327/108 |
| 6,842,361 B2 | 1/2005 | Miyatke et al. | |
| 7,026,847 B2 * | 4/2006 | Wang et al. | 327/112 |
| 7,116,135 B2 * | 10/2006 | Wang et al. | 327/108 |
| 7,394,685 B2 | 7/2008 | Ooishi et al. | |
| 7,576,573 B2 * | 8/2009 | Nguyen | 327/100 |
| 7,586,341 B2 * | 9/2009 | Wang et al. | 327/108 |
| 7,742,329 B2 | 6/2010 | Yoon et al. | |
| 7,936,592 B2 | 5/2011 | Wang et al. | |
| 2008/0189588 A1 | 8/2008 | Tanaka et al. | |
| 2008/0215954 A1 | 9/2008 | Oshikiri | |

OTHER PUBLICATIONS

Notice of Allowance for U.S. Appl. No. 12/544,189, mailed on Aug. 24, 2011.
Notice of Allowance for U.S. Appl. No. 12/558,451 mailed on Aug. 11, 2011.

* cited by examiner

*Primary Examiner* — Lincoln Donovan
*Assistant Examiner* — Khareem E Almo
(74) *Attorney, Agent, or Firm* — Renaissance IP Law Group LLP (57) ABSTRACT Circuit includes, in part, random access memory cells, column decoders, row decoders, and write driver circuit. Driver circuit is responsive to data and control signals. Writing data includes multiple write phases, each phase driving predetermined current through selected cell by driver setting predetermined voltages to first and second lines. Voltages are in sets such that sequential voltages of each set correspond to respective phase. During writing of first data to selected cell, driver circuit causes first signal line to be at second voltage set and second signal line to be at first voltage set. Second voltage set is greater than first voltage set. During writing of second data to selected cell, driver cause first signal line to be at third voltage set and second signal line to be at fourth voltage set. Third voltage set is smaller than the fourth voltage set.

10 Claims, 11 Drawing Sheets

MULTI-SUPPLY SYMMETRIC DRIVER CIRCUIT AND TIMING METHOD

CROSS-REFERENCES TO RELATED APPLICATIONS

The present application claims benefit under 35 USC 119 (e) of U.S. provisional application No. 61/352,306, filed Jun. 7, 2010, entitled "Multi-Supply Symmetric Driver Circuit and Timing Method," the content of which is incorporated herein by reference in its entirety.

This application is related to commonly assigned U.S. patent application Ser. No. 12/544,189, filed Aug. 19, 2009; and commonly assigned U.S. patent application Ser. No. 12/558,451, filed Sep. 11, 2009, the contents of all of which are incorporated herein by reference in their entirety.

STATEMENT AS TO RIGHTS TO INVENTIONS MADE UNDER FEDERALLY SPONSORED RESEARCH OR DEVELOPMENT

This invention was made with U.S. Government support under Grant/Contract No. HR0011-09-C-0023 awarded by the DARPA. The U.S. Government retains certain rights in this invention.

BACKGROUND

The present invention relates to memory integrated circuits, and more particularly to writing of data to a magnetic random access memory.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device loses its data when the power applied to it is turned off. In contrast, a non-volatile semiconductor memory device, such as a Flash Erasable Programmable Read Only Memory (Flash EPROM) or a magnetic random access memory (MRAM), retains its charge even after the power applied thereto is turned off. Therefore, where loss of data due to power failure or termination is unacceptable, a non-volatile memory is used to store the data.

Figure 1A:
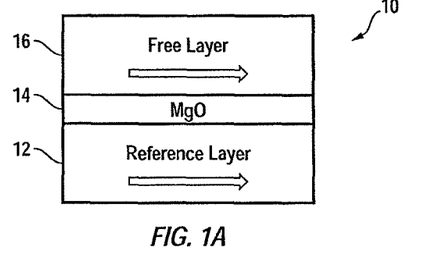
FIG. 1A is a simplified cross-sectional view of a magnetic tunnel junction structure of a magnetic random access memory cell when placed in a parallel magnetization state, as known in the prior art.
Figure 1B:
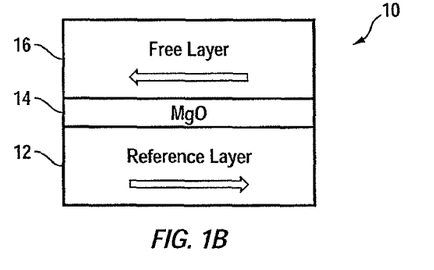
FIG. 1B shows the magnetic tunnel junction structure of FIG. 1A when placed in an anti-parallel magnetization state, as known in the prior art.
Figure 1C:
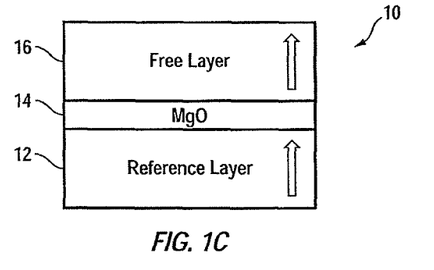
FIG. 1C is a simplified cross-sectional view of a magnetic tunnel junction structure of a magnetic random access memory cell when placed in a parallel magnetization state, as known in the prior art.
Figure 1D:
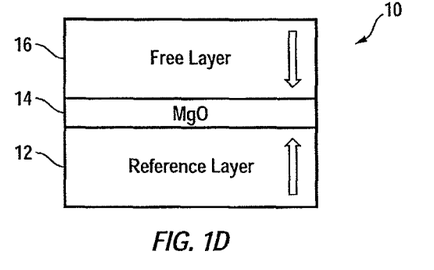
FIG. 1D shows the magnetic tunnel junction structure of FIG. 1D when placed in an anti-parallel magnetization state, as known in the prior art.

FIG. 1A is a simplified cross-sectional view of a magnetic tunnel junction (MTJ) structure 10 used in forming a spin transfer torque (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 16 are assumed to have the same magnetization direction, i.e., they are in a parallel state. In FIG. 1B, reference layer 12 and free layer 16 are assumed to have opposite magnetization directions, i.e., they are in an anti-parallel state. In FIG. 1C, reference layer 12 and free layer 16 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 12 to free layer 16 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ should be greater than a respective pair of threshold values. The voltage that should exceed a threshold voltage in order for the switching to occur is also referred to as the switching voltage $V_c$. Likewise, the current that should exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

Figure 2A:
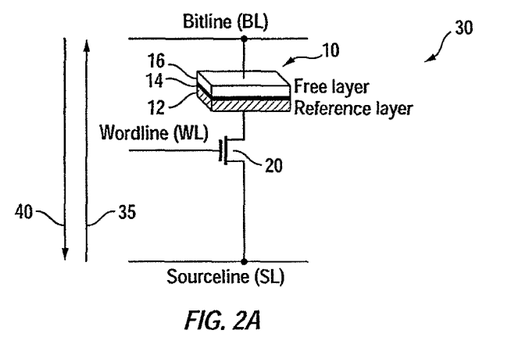
FIG. 2A shows a number of layers of a magnetic tunnel junction structure coupled to an associated select transistor, as known in the prior art.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver circuit adapted to deliver sufficient current to write a "0", may not be able to provide enough current to write a "1". Similarly, a write driver circuit adapted to deliver sufficient current to write a "1" may deliver a current that is greater than what would otherwise be an acceptable current level to write a "0".

Figure 2B:
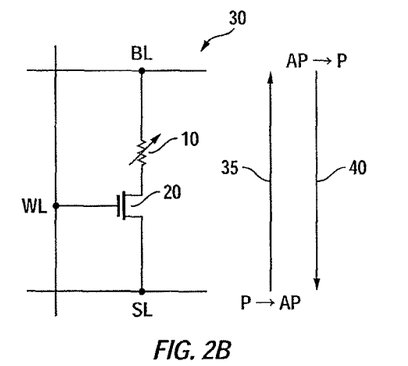
FIG. 2B is a schematic representation of the magnetic tunnel junction structure and its associated select transistor of FIG. 2A, as known in the prior art.

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$ or $R_P$ state Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

Figure 3:
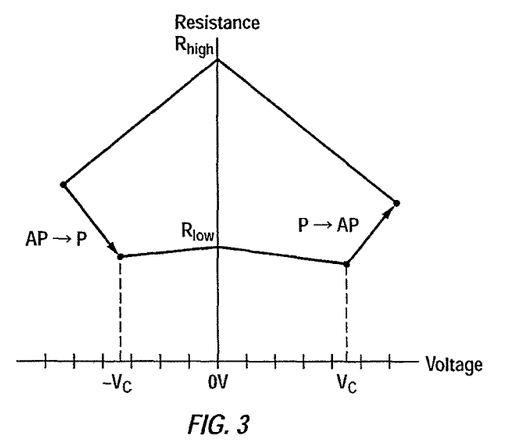
FIG. 3 shows the variation in the resistance of the magnetic tunnel junction structure of FIG. 2A in response to applied voltages, as known in the prior art.

As described above, the voltage required to switch an MTJ from an AP state to a P state, or vice versa, should exceed a critical value Vc. The current corresponding to this voltage is referred to as the critical current Ic. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no or very small voltage. Likewise, the resistance of the MTJ is $R_{low}$ when it is in P state and receives no or very small voltage.

Figure 4A:
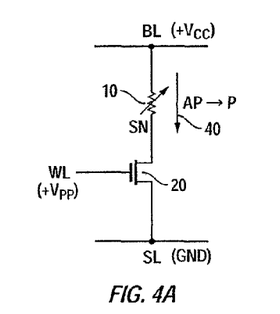
FIG. 4A shows a magnetic tunnel junction structure being programmed to switch from an anti-parallel state to a parallel state, as known in the prior art.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL) of transistor 20 is coupled to the ground potential via a resistive path (not shown), a positive voltage Vpp is applied to the gate node (WL or wordline) of transistor 20, and a positive voltage $V_{cc}$ is applied to the drain node (BL or bitline) of transistor 20.

Figure 4B:
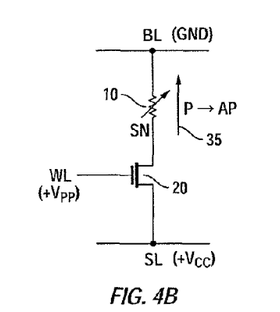
FIG. 4B shows a magnetic tunnel junction structure being programmed to switch from a parallel state to an anti-parallel state, as known in the prior art.
Figure 5:
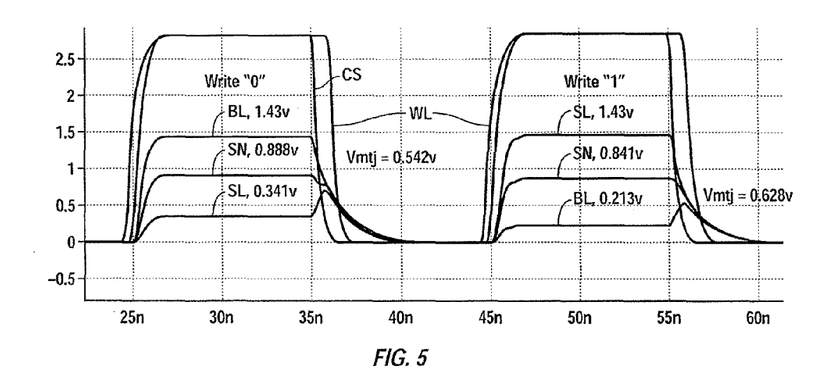
FIG. 5 is an exemplary timing diagram of a number of signals associated with a magnetic random access memory during write "0" and write "1" operations, as known in the prior art.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{CC}$ is assumed to be 1.8 volts. Signal WL as well as signal CS, which is a column select signal, are shown as having been boosted to a higher Vpp programming voltage of 3.0 volts. During the write "0" operation, the voltages at nodes BL, SL and SN are shown as being approximately equal to 1.43 V, 0.34 V, and 0.88 V respectively. During the write "1" operation, the voltages at nodes BL, SL and SN are shown as being approximately equal to 0.23 V, 1.43 V, and 0.84 V respectively. Although not shown, for this exemplary computer simulation, the currents flowing through the MTJ during write "0" and "1" operations are respectively 121 µA and 99.2 µA.

FIG. 4B shows an MTJ being programmed to switch from a parallel state to an anti-parallel state so as to store a "1". It is assumed that MTJ 10 is initially in a logic "0" or P state. To store a "1", a current $I_c$ greater than the critical current is caused to flow through transistor 20 in the direction of arrow 35. To achieve this, node SL is supplied with the voltage $V_{cc}$ via a resistive path (not shown), node WL is supplied with the voltage Vpp, and node BL is coupled to the ground potential via a resistive path (not shown). Accordingly, during a write "1" operation, the gate-to-source voltage of transistor 20 is set to ($V_{WL}-V_{SN}$), and the drain-to-source voltage of transistor 20 is set to ($V_{SL}-V_{SN}$).

Because the gate-to-source and drain-to-source voltages of transistor 20 are higher under the conditions described with reference to FIGS. 4A and 5 than they are under the conditions described with reference to FIGS. 4B and 5, the corresponding current flow through the MTJ is higher when attempting to write a logic "0" than a logic "1". Accordingly, the voltages designed to generate the critical current needed to carry out a write "0" operation may not be sufficient to carry out a write "1" operation. An undesirable asymmetry thus exists in the current levels during write "1" and write "0" operations. Consequently, a transistor size selected to provide sufficient current to write a "0" may not provide enough current to write a "1". Alternatively, a larger transistor size selected to provide the required current to write a "1", may result in generation of excessive current when writing a "0". Such an excess current may damage the tunneling layer of the MTJ shown in FIG. 1.

BRIEF SUMMARY

The present invention relates to memory integrated circuits, and more particularly to writing of data to a magnetic random access memory.

According to one embodiment of the present invention, a circuit includes a first driver circuit adapted to supply at least a first voltage during at least a first time period, and at least a second voltage during at least a second time period on a first supply line. A second driver circuit is adapted to supply at least a third voltage during at least the first time period, and at least a fourth voltage during at least the second time period on a second supply line.

According to one specific embodiment, the first driver circuit is further adapted to supply at least a fifth voltage during at least a third time period, and at least a sixth voltage during at least a fourth time period on the first supply line. The second driver circuit is further adapted to supply at least a seventh voltage during at least the third time period, and at least an eighth voltage during at least a fourth time period on the second supply line.

According to another specific embodiment, the first driver circuit is further adapted to supply a ground voltage during at least a third time period on the first supply line, and the second driver circuit is further adapted to supply a ground voltage during at least the third time period on the second supply line.

According to another specific embodiment, the first driver circuit is further adapted to supply at least the first voltage during at least a third time period on the first supply line, and the second driver circuit is further adapted to supply at least the third voltage during at least the third time period on the second supply line.

According to another specific embodiment, the first voltage is higher than the third voltage, and the second voltage is higher than the fourth voltage. According to another specific embodiment, the seventh voltage is higher than the fifth voltage, and the eighth voltage is higher than the sixth voltage.

According to another specific embodiment, the first driver circuit is further adapted to supply at least a fifth voltage during at least a fourth time period, at least a sixth voltage during at least a fifth time period, and at least the fifth voltage during at least a sixth time period on the first supply line. The second driver circuit is further adapted to supply at least a seventh voltage during at least the fourth time period, at least an eighth voltage during at least a fifth time period, and at least the seventh voltage during at least the sixth time period on the second supply line.

According to another specific embodiment, the first voltage is higher than the second voltage. According to another specific embodiment, the first voltage is lower than the second voltage. According to another specific embodiment, the seventh voltage is higher than the eighth voltage. According to another specific embodiment, the seventh voltage is lower than the eighth voltage.

According to one embodiment of the present invention, a method of driving a first supply line and a second supply line, the method includes supplying at least a first voltage during at least a first time period, and at least a second voltage during at least a second time period on the first supply line. The method further includes supplying at least a third voltage during at least the first time period and at least a fourth voltage during at least the second time period on the second supply line.

According to one specific embodiment, the method further includes supplying at least a fifth voltage during at least a third time period, and at least a sixth voltage during at least a fourth time period on the first supply line. The method further includes supplying at least a seventh voltage during at least the third time period, and at least an eighth voltage during at least a fourth time period on the second supply line.

According to another specific embodiment, the method further includes supplying a ground voltage during at least a third time period on the first supply line, and supplying a ground voltage during at least the third time period on the second supply line.

According to another specific embodiment, the method further includes supplying at least the first voltage during at least a third time period on the first supply line, and supplying at least the third voltage during at least the third time period on the second supply line.

According to another specific embodiment, the first voltage is higher than the third voltage, and the second voltage is higher than the fourth voltage. According to another specific embodiment, the seventh voltage is higher than the fifth voltage, and the eighth voltage is higher than the sixth voltage.

According to another specific embodiment, the method further includes supplying at least a fifth voltage during at least a fourth time period, at least a sixth voltage during at least a fifth time period, and at least the fifth voltage during at least a sixth time period on the first supply line. The method further includes supplying at least a seventh voltage during at least the fourth time period, at least an eighth voltage during at least a fifth time period, and at least the seventh voltage during at least the sixth time period on the second supply line.

According to another specific embodiment, the first voltage is higher than the second voltage. According to another specific embodiment, the first voltage is lower than the second voltage. According to another specific embodiment, the seventh voltage is higher than the eighth voltage. According to another specific embodiment, the seventh voltage is lower than the eighth voltage.

A better understanding of the nature and advantages of the present invention may be gained with reference to the following detailed description and the accompanying drawings.

DETAILED DESCRIPTION OF THE INVENTION

In accordance with one embodiment of the present invention, the voltages applied to the terminals of a spin transfer torque magnetic random access memory (STT-MRAM) cell disposed in an array are varied in accordance with the data being written to the MRAM cell. Accordingly, the current that changes the state of the MRAM cell from P to AP and the current that changes the state of the MRAM cell from AP to P are independently controlled to achieve reduction in the total writing energy while ensuring sufficient current during both write "1" and write "0" operations respectively. The following description is provided with reference to a write driver circuit that changes the voltage applied to the source terminal of an associated select transistor disposed in each MRAM cell. Embodiments of the present invention, may also vary the voltage applied to drain, as well as to the voltages applied to both the drain and source regions of such a select transistor.

In an array of MRAM cells, the initial magnetization angle of the free layer deviates slightly from the ideal angle from bit to bit. Since the switching time varies with this initial angle, the variation in switching time may be large. Switching time may, accordingly, be sufficiently long enough to ensure switching for the entire distribution of cells in the array which results in wasted total writing energy. In accordance with another embodiment of the present invention, a multi-supply write drive circuit is described which reduces switching time variation and total writing energy.

Figure 6:
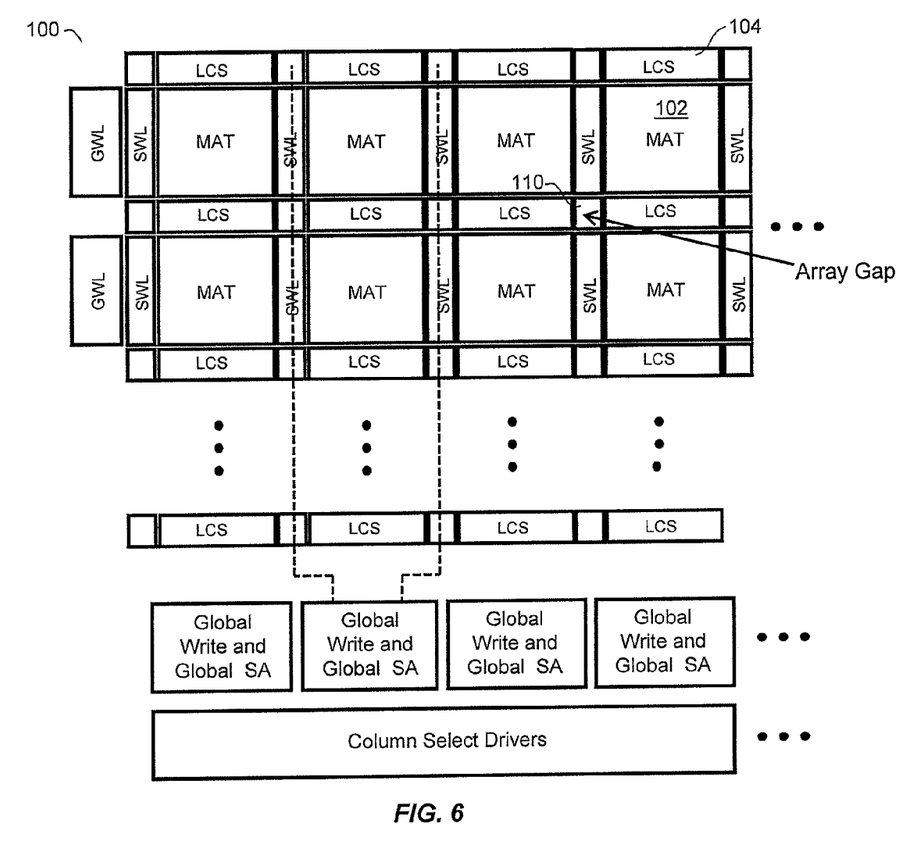
FIG. 6 is a block diagram of a MRAM array and associated writing and reading circuitry, in accordance with one embodiment of the present invention.

FIG. 6 is a block diagram of a MRAM array and associated writing and reading circuitry 100, hereinafter alternatively referred to as MRAM 100, in accordance with one embodiment of the present invention. MRAM 100 includes a multitude of array blocks selected by a column select driver, a multitude of global write, a multitude of global sense amp (SA), a multitude of global word line (GWL) circuits, and a control circuit (not shown). Each block may include an array of MRAM cells (memory array tile, or MAT) 102 whose rows are selected by one or more sub word line (SWL) circuits and whose columns are selected by one or more local column select circuits (LCS) 104. The corners of each block include an array gap area 110 to be described in further detail below.

Figure 7:
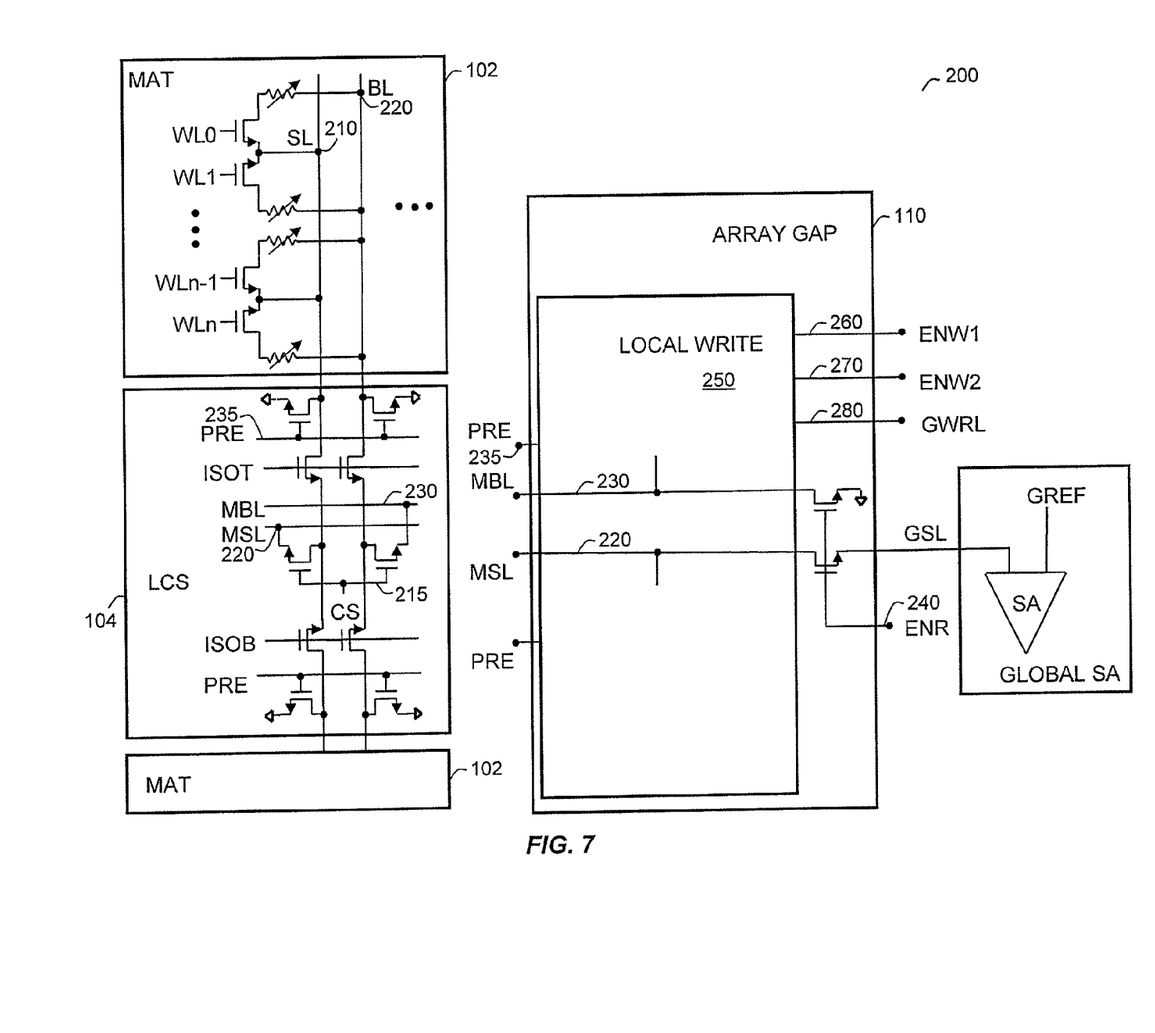
FIG. 7 is a schematic diagram of portions of the MRAM array of FIG. 6 and associated writing and reading circuitry, in accordance with one embodiment of the present invention.

FIG. 7 is a schematic diagram 200 of portions of MRAM 100, in accordance with one embodiment of the present invention. Schematic diagram 200 is shown as including MAT 102, LCS 104, array gap 110, and a global SA.

MAT 102 includes a number of MRAM cells whose select transistors are coupled to word lines, WL0-WLn driven by the SWL and the GWL. The MRAM cells are also coupled to a source line (SL) 210 and a bit line (BL) 220 pair. The MAT includes a multitude of SL and BL pairs selectable by LCS 104. The LCS includes pairs of n-channel select transistors which couple a selected SL and BL pair in MAT 102 to a pair of MSL 220 and MBL 230 lines under control of a column select (CS) 215, a precharge (PRE) 235, an isolation top (ISOT), and an isolation bottom (ISOB) signal. The LCS determines whether to couple adjacent MAT 102 above or below the LCS by enabling one of the respective ISOT or ISOB signals. In the example shown in FIG. 7, the top MAT is selected by enabling ISOT and disabling ISOB. One of the multitude of SL and BL pairs is selected by the CS signal driven by the column select drivers, to couple the selected SL and BL pair to the respective MSL and MBL lines. The SL/BL and respective MSL/MBL lines are ready for write or read operation modes when PRE is disabled. MSL 220 and MBL 230 are coupled from LCS 104 to array gap 110.

Array gap 110 includes a local write circuit 250 and a pair of n-channel select transistors whose gates are coupled to an enable read (ENR) 240 signal. During read mode operation, ENR 240 is taken high and one of the pair of n-channel select transistors couples MBL 230 to ground voltage while the other transistor couples MSL 220 to a global source line (GSL) where the data signal from the selected MRAM cell is sensed by a global SA. During write mode operation ENR 240 is taken low and both of the pair of n-channel select transistors are off, thus isolating the MSL and MBL lines from the global SA circuits. Also, during write mode operation, local write circuit 250 drives the MSL and MBL lines (and the respective SL and BL line pair) under control of a number of enable write lines including an ENW1 260 and an ENW2 270 and a global write line (GWRL) 280.

As discussed above, in accordance with some embodiments of the present invention, the write switching time and total write energy in the array of MRAM cells is reduced. One of the embodiments of this invention accomplishes that reduction by providing a multi-supply drive circuit capable of generating either positive or negative pulses of predetermined voltage and duration in multiple phases, each phase driving a predetermined current through the selected cell. The sequence write phases may then be adjusted to reduce the deviation in the magnetization angle from the ideal desired angle as are discussed below.

Figure 8:
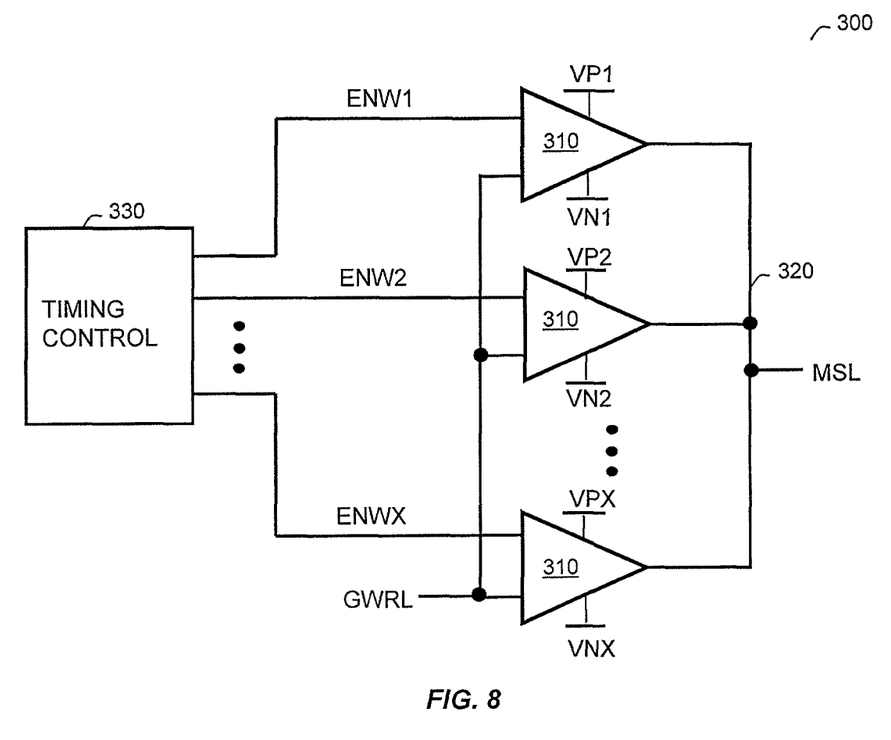
FIG. 8 is a schematic diagram of a multi-supply drive circuit in accordance with one exemplary embodiment of the present invention.

FIG. 8 is a schematic diagram of a multi-supply drive circuit 300 in accordance with one exemplary embodiment of the present invention. Multi-supply drive circuit 300 includes multiple power supply selection circuits 310 each driving a common output 320. Output 320 may correspond to a MBL line as shown or may be a MSL line (not shown). The multiple power supply selection circuits 310 may include a number X of such power supply selection circuits. The power supply selection circuits are coupled to respective positive supplies, VP1-VPX, and to respective negative supplies, VN1-VNX. Power supply selection circuits 310 are enabled by respective non-overlapping control signals, ENW1-ENWX, which are generated by a timing control circuit 330. The selection of either VPX or VNX is controlled by a global write line (GWRL). The control signals ENW1 through ENWX are non-overlapping to prevent power supply contention. The power supply selection circuits 310 may be sequenced in a predetermined order to generate a predetermined write pulse shape. For example, if VP2 followed by VP1 is to be coupled to output 320; EN2 is enabled which selects power supply selection circuit 2 and GWRL is set high to output VP2, VP1 may then be output by first deactivating EN2 and activating EN1 which selects power supply selection circuit 1 and continuing to set GWRL to high. If, for example, the output is to be driven by a VNX voltage the GWRL is set low. Pulse length and sequence order are controlled by timing control circuit 330. Thus, multi-supply drive circuit 300 is capable of flexibly driving MSL or MBL lines to one of either positive or negative predetermined voltage of predetermined pulse length and at predetermined sequencing.

In some embodiments, CMOS technology is included to implement the embodiments shown in FIGS. 8, 9, and 13 (described below) and various supply values which may be above the normal Vcc logic supply or below ground potential, may be included. Various supplies may be provided through on chip charge pumps of either polarity or external power supplies. Care should be exercised so CMOS wells for p-channel transistors are biased to the most positive supply within a supply domain while the wells for n-channel transistors are biased to the most negative supply within that supply domain to prevent forward biasing wells and shorting out power supplies. In addition, signal levels may need to swing between larger levels than normal logic levels to ensure proper transistor gate to source drive voltage to completely switch transistors off and on. Such drive signals may be accomplished through level shifting and other means. These techniques are known by persons of ordinary skill in the art and such details have been omitted from the figures of the embodiments for simplicity.

Some embodiments independently control the current during write "1" and write "0" operations to achieve reduction in the total writing energy while ensuring sufficient current during both write "1" and write "0" operations in the array of MRAM cells. This is achieved by driving the MSL and MBL lines which are coupled to a selected MRAM cell to appropriate voltages. FIG. 9 is a schematic diagram of a multi-supply local write circuit 400 in accordance with one exemplary embodiment of the present invention. Multi-supply local write circuit 400 corresponds to local write circuit 250 which drives the MBL and MSL lines under control of ENW1 260, ENW2 270 and GWRL 280 as shown in FIG. 7. Referring to FIG. 9, multi-supply local write circuit 400 includes an inverter 403 and a pair of multi-supply drive circuits 401 and 402. Multi-supply drive circuits 401 and 402 are similar and symmetric circuit topologies except for the differences described below. Multi-supply drive circuit 401 includes NAND gates 404 and 408, p-channel transistors 405 and 409, n-channel transistors 406, 407, 410, 411 and 412. Circuit 401 is adapted to receive input signals ENW1 260, ENW2 270 and GWRL 280, and in response generate output signal MSL 220. Circuit 401 receives positive supplies VPS1 and VPS2 and negative supplies VNS1 and VNS2. Multi-supply drive circuit 401 is analogous to multi-supply drive circuit 300 shown in FIG. 8 with X=2 and VP1 and VP2 corresponding to VPS1 and VPS2 respectively and VN1 and VN2 corresponding to VNS1 and VNS2 respectively. Referring again to FIG. 9, multi-supply drive circuit 402 is adapted to receive input signals ENW1, ENW2 and the logical inversion of GWRL through inverter 403, and in response generate output signal MBL 230. Circuit 402 receives positive supplies VPB1 and VPB2 and negative supplies VNB1 and VNB2. Circuit 402 is also analogous to multi-supply drive circuit 300 with X=2 and VP1 and VP2 corresponding to VPB1 and VPB2 respectively and VN1 and VN2 corresponding to VNB1 and VNB2 respectively.

Figure 9:
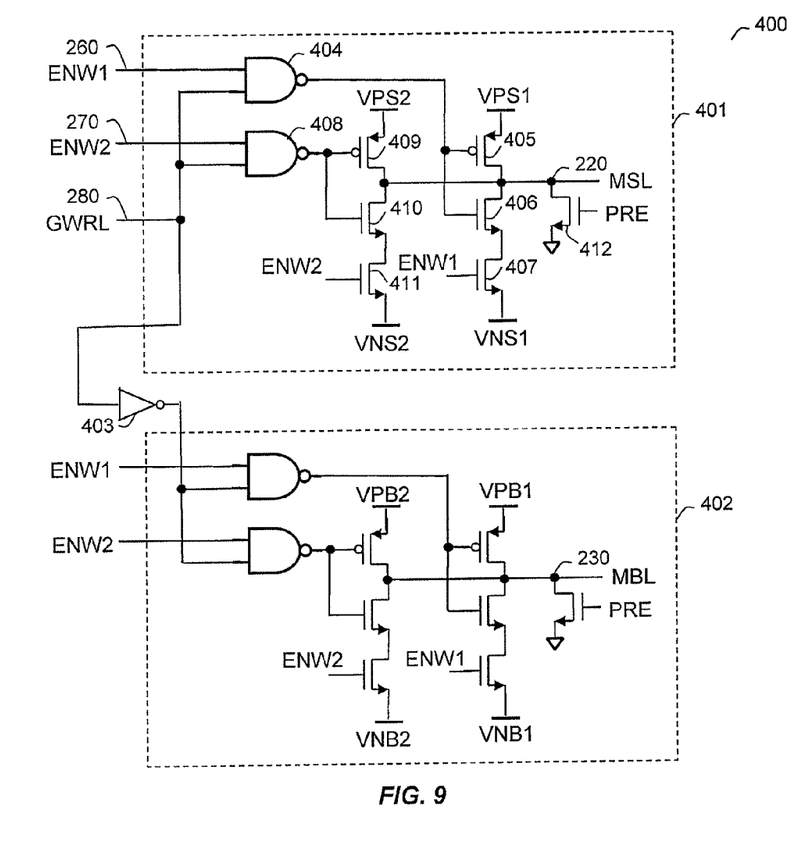
FIG. 9 is a schematic diagram of a multi-supply local write circuit in accordance with one exemplary embodiment of the present invention.

In one embodiment, the NAND and inverter gates shown in FIG. 9 may be driven by appropriate voltages Vdd>=VPx, |Vss|>=|VNx|. To drive devices fully on or off and to reduce circuit complexity, input signals such as GWRL, ENW1, and ENW2 are level shifted to the highest/lowest supply voltages, Vdd/Vss. In another embodiment to reduce circuit layout area, all the PMOS devices may be in one n-well type and all the NMOS devices may be in one p-well type. For example, if Vdd=Vpp is the most positive voltage and Vss=Vbb is the most negative voltage, then signals GWRL, ENW1, and ENW2 may drive to Vpp and Vbb for logic high and low respectively. Then the n-well and source nodes for the PMOS devices in the NAND and inverter gates may be tied to Vpp. Analogously, p-well and source nodes for NMOS devices may be tied to Vbb. In another embodiment, a clamp device may be coupled to each power supply node (VPx and VNx) connected to external power supplies to ensure the substrate/wells are reverse biased during power-up to reduce power and prevent the problem of CMOS latchup.

In FIG. 9 during write operation PRE is deasserted. In the embodiment shown in FIG. 9, a signal is asserted when receiving a high logic level corresponding to the voltage Vcc, Vpp, or in-between and deasserted when receiving a low logic level corresponding to the ground potential or below ground potential, as is well known. It is understood that in other embodiments, a signal may be asserted when receiving a low logic level, and deasserted when receiving a high logic level.

Referring to FIG. 9, the operation of multi-supply write circuit 401 is analogous to the operation of multi-supply drive circuit 300 described above in FIG. 8. In write mode operation, FIG. 9 shows the deassertion of PRE causes transistor 412 to turn off and frees MSL from ground. The assertion of ENW1 and GWRL forces the output of NAND gate 404 low (low logic level) thereby causing transistor 405 to turn on and transistor 406 to turn off which couples MSL to VPS1. ENW1 and ENW2 are not asserted simultaneously to prevent power supply contention so when ENW1 is asserted, ENW2 is deasserted and visa versa. The deassertion of ENW2 forces the output of NAND gate 408 high thereby turning transistor 409 off and transistor 410 on but since ENW2 is deasserted, transistor 411 is also turned off which isolates MSL from both VPS2 and VNS2. Similarly, the assertion of ENW2 and GWRL forces the output of NAND gate 408 low thereby turning transistor 409 on and transistor 410 off which couples MSL to VPS2. In that case, since ENW1 is deasserted, transistor 407 is off and the output of NAND gate 404 is high thereby turning transistor 405 off which isolates MSL from both VPS1 and VNS1. The deassertion of GWRL causes the output of both NAND gates 404 and 408 to go high thereby causing transistors 405 and 409 to be off thus isolating MSL from both VPS1 and VPS2 while turning on both transistors 406 and 410. In this case, the assertion of ENW1 turns on transistor 407 which couples MSL to VNS1 while the deassertion of ENW2 turns off transistor 411 which isolates MSL from VNS2. Similarly, the assertion of ENW2 turns on transistor 411 which couples MSL to VNS2 while the deassertion of ENW1 turns off transistor 407 which isolates MSL from VNS1. In summary, assertion of ENW1 and GWRL couples MSL to VPS1, assertion of ENW2 and GWRL couples MSL to VPS2, assertion of ENW1 and deassertion of GWRL couples MSL to VNS1, and assertion of ENW2 and deassertion of GWRL couple MSL to VNS2. In other words, ENW1 and ENW2 select a corresponding pair of positive and negative supplies while GWRL selects between the selected positive and negative supplies.

The embodiment shown in FIG. 9 is not limited to just two ENW1 and ENW2 signals, and other embodiments may include a multitude of ENWX signals coupled to a multitude of corresponding NAND gates, and a multitude of series coupled transistors selecting respective VPX and VNX supplies responsive to the ENWX and GWRL signals analogous to the multi-supply drive circuit 300 shown in FIG. 8.

The operation of multi-supply write circuit 402 shown in FIG. 9 is analogous to the operation of multi-supply write circuit 401 and multi-supply drive circuit 300 shown in FIG. 8 described above and will not be described in detail because their structures and operations are similar except as noted below. The multi-supply write circuit 402 shown in FIG. 9 may operate with the key difference from circuit 401 being that circuit 402 takes input from the inverted GWRL signal output from inverter 403. Another difference is circuit 402 may couple MBL to a different set of supply values than circuit 401. In summary; assertion of ENW1 and GWRL couples MBL to VNB1, assertion of ENW2 and GWRL couples MBL to VNB2, assertion of ENW1 and deassertion of GWRL couples MBL to VPB1, and assertion of ENW2 and deassertion of GWRL couples MBL to VPB2.

Referring again to FIG. 9, during write mode, the multi-supply local write circuit 400 may symmetrically cause the MSL and MBL lines to be coupled to positive and negative supplies respectively to change the state of the selected MRAM cell from P to AP (write "1") or to negative and positive supplies respectively to change the state of the selected MRAM cell from AP to P (write "0") responsive to the logic state of the GWRL line. Thus GWRL corresponds to a data signal line for controlling the programming state to be stored in the selected MRAM cell coupled to the MSL and MBL lines by the circuits in FIGS. 6 and 7. FIG. 9 shows the supply voltages coupled to the MSL and MBL lines may be independently controlled so that the current flowing in the selected MRAM cell may be optimized for both write "1" and write "0" operation to reduce total writing energy. The circuit 400 is capable of further reduction in total writing energy as discussed herein.

As discussed above, in accordance with some embodiments of the present invention, the write switching time and total write energy in the array of MRAM cells is reduced. One of the embodiments of this invention accomplishes that reduction by providing a multi-supply drive circuit capable of coupling either positive or negative pulses of predetermined voltage of predetermined length and at predetermined sequencing to a selected MRAM cell. One embodiment of the invention to reduce write switching time includes a multi phase write pulse sequence including a first phase providing a higher current or an overdrive write pulse for a predetermined length of time to a selected cell, followed by providing a lower current write pulse during a second phase of the write pulse sequence. The second phase may be of a different or an equal predetermined length of time than the first phase. The overdrive writing pulse forces higher current through the MRAM cell than the current during the second phase of writing. The higher current during the overdrive writing pulse is obtained by applying a higher voltage swing between the MBL and SBL lines which are coupled to the selected MRAM cell. The second phase of the write pulse may force less current than the first phase and may equal the current of a typical single phase write pulse or may be a different current than a typical single phase write pulse. This embodied method are called a "leading high" write pulse and may be accomplished with the circuits described above in the embodiments of FIGS. 7 through 9.

Figure 10:
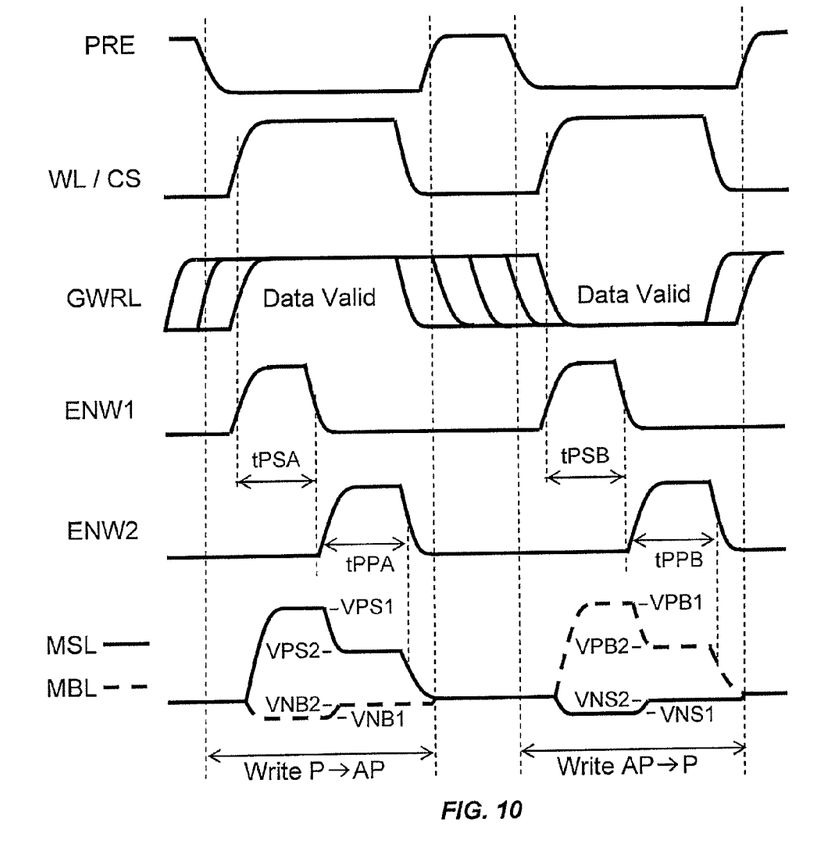
FIG. 10 is a first timing diagram of a number of signals used during write operation of the MRAM array of FIG. 6, in accordance with one exemplary embodiment of the present invention.

FIG. 10 is a leading high pulse timing diagram of the voltage signals at nodes PRE, WL, CS, GWRL, ENW1, ENW2, MSL, and MBL of portions of the MRAM 100 and associated writing circuitry of FIG. 7 and FIG. 9 during a write "1" or "P to AP" followed by a write "0" or "AP to P" operation method in accordance with one exemplary embodiment of the present invention. To begin a write "P to AP" operation, FIG. 10 includes deasserting PRE to release MSL and MBL from ground. Next, WL and CS signals may be asserted to select a MRAM cell while GWRL (data in) and ENW1 may be set high. Setting ENW1 high starts the first phase which causes MSL (shown as a solid line) to be driven to VPS1 while MBL (shown as a dashed line) is driven to VNB1 for a predetermined time tPSA responsive to commands issued from timing control 330. During the first phase, the large voltage swing between VPS1 and VNB1 in this embodiment creates an overdrive of current in the selected MRAM cell. Bringing ENW1 low terminates the first phase after the predetermined time tPSA has elapsed. The second phase of the write operation begins by setting ENW2 high which causes MSL to be driven to VPS2 while MBL is driven to VNB2 for a predetermined time tPPA. During the second phase, the smaller swing between VPS2 and VNB2 in this embodiment drives a lesser or normal programming current in the selected MRAM cell. Bringing ENW2 low terminates the second phase after the predetermined time tPPA has elapsed. The cell WL, CS and GWRL are then deasserted causing the MRAM cell to be deselected and releasing the MSL and MBL lines. PRE is asserted to end the write P to AP operation to couple the MSL and MBL lines to ground.

Still to FIG. 10, the sequence is repeated for a write AP to P operation in similar fashion except the ENW1 pulse is asserted during the first phase for a predetermined period tPSB which causes MSL to be driven to VNS1 while MBL is driven to VPB1. Then, the ENW2 pulse is asserted during the second phase for a predetermined period tPPB which causes MSL to be driven to VNS2 while MBL is driven to VPB2. In this embodiment, the supply voltages for writing P to AP are chosen such that; VPS2 is lower than VPS1 and VNB2 is higher than VNB1, while the set of voltages VPS1 and VPS2 are higher than the set of voltages VNB1 and VNB2. Also in this embodiment, the supply voltages for writing AP to P are chosen such that VPB2 is lower than VPB1 and VNS2 is higher than VNS1, while the set of voltages VPB1 and VPB2 are higher than the set of voltages VNS1 and VNS2. Also, the supply voltage VPB1 has a predetermined relationship to VPS1, and the time interval tPSB and tPPB have predetermined relationships to tPSA and tPPA respectively, such that the current flowing in the selected cell may be independently controlled to optimize the current for both write "1" and write "0" operation to reduce total writing energy. The leading high write pulse embodiment reduces the write switching time and further reduces the total write energy in the array of MRAM cells.

Another embodiment of the invention to reduce write switching time includes a multi phase write pulse sequence including a second phase providing a higher current or an overdrive write pulse for a predetermined length of time to a selected MRAM cell, preceded by a lower current write pulse during a first phase of the write pulse sequence. The second phase may be of a different or an equal predetermined length of time than the first phase. The overdrive writing pulse forces higher current through the MRAM cell than the current during the first phase writing. The higher current during the overdrive writing pulse is obtained by applying a higher voltage swing between the MBL and SBL lines which are coupled to the selected MRAM cell. The first phase of the write pulse may force less current than the second phase and may equal the current of a typical single phase write pulse or may be a different current than a typical single phase write pulse. This embodied method are called a "leading low" write pulse and may be accomplished with the circuits described above in the embodiments of FIGS. 7 through 9.

Figure 11:
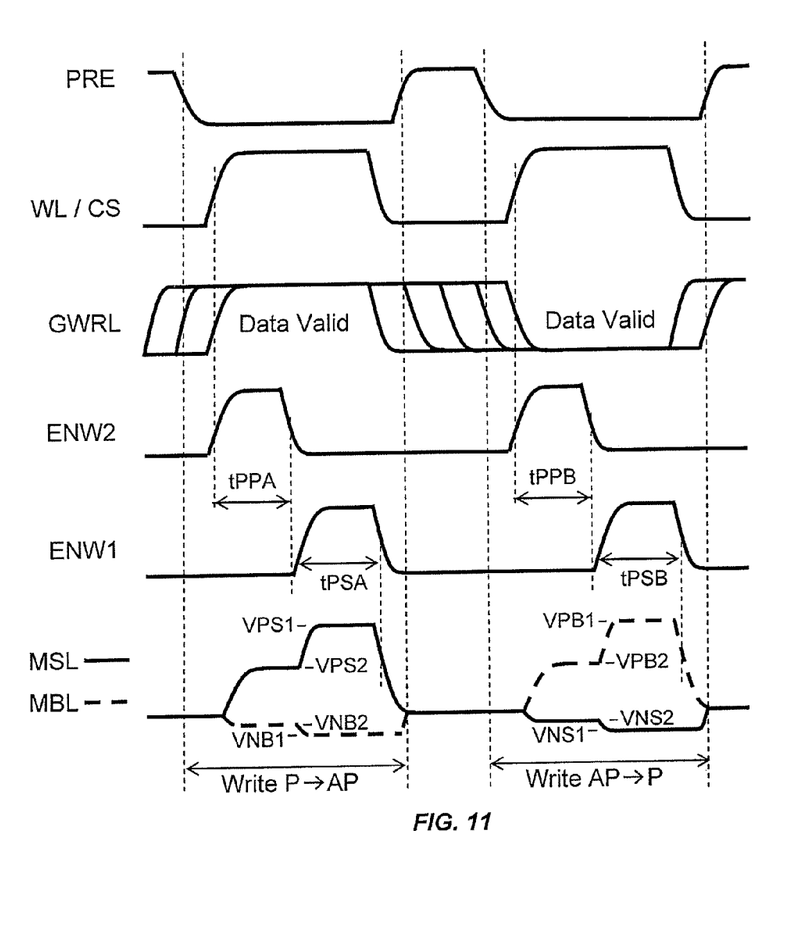
FIG. 11 is a second timing diagram of a number of signals used during write operation of the MRAM array of FIG. 6, in accordance with one exemplary embodiment of the present invention.

FIG. 11 is a leading low pulse timing diagram of the voltage signals at nodes PRE, WL, CS, GWRL, ENW1, ENW2, MSL, and MBL of portions of MRAM 100 and associated writing circuitry of FIG. 7 and FIG. 9 during a write "1" or "P to AP" followed by a write "0" or "AP to P" operation method, in accordance with one exemplary embodiment of the present invention. The embodiment in FIG. 11 utilizes the same circuit topology and supply value relationships as were described in FIG. 10. The method of operation in FIG. 11 is analogous to FIG. 10 and will not be described in detail because their structures and operations are similar except as noted below. The difference between FIG. 10 and FIG. 11 includes asserting ENW2 during the first phase for time tPPA and tPPB and ENW1 during the second phase for time tPSA and tPSB. In other words, the order of asserting ENW1 and ENW2 is swapped between FIGS. 10 and 11.

Another embodiment (not shown) to achieve the leading low write pulse includes asserting ENW1 for durations tPSA and tPSB during the first phase and asserting ENW2 for durations tPPA and tPPB during the second phase similar to the sequencing ENW1 and ENW2 in FIG. 10 which, however, requires different voltage relationships for the supplies compared to FIG. 10 so that more current is driven during the second phase than during the first phase (as in FIG. 11) by driving a larger voltage swing on the MBL and MSL lines during the second phase writing pulse than during the first phase writing pulse. In this embodiment, the supply voltages for writing P to AP are chosen such that; VPS1 is lower than VPS2 and VNB1 is higher than VNB2, while the set of voltages VPS1 and VPS2 are higher than the set of voltages VNB1 and VNB2. Also in this embodiment, the supply voltages for writing AP to P are chosen such that VPB1 is lower than VPB2 and VNS1 is higher than VNS2, while the set of voltages VPB1 and VPB2 are higher than the set of voltages VNS1 and VNS2. Also, the supply voltage VPB1 has a predetermined relationship to VPS1, and the time interval tPSB and tPPB have predetermined relationships to tPSA and tPPA respectively, such that the current flowing in the selected cell may be independently controlled to optimize the current for both write "1" and write "0" operation to reduce total writing energy. The leading low write pulse embodiment reduces the write switching time and further reduces the total write energy in the array of MRAM cells and may be accomplished with the circuits described above in the embodiments of FIGS. 7 through 9.

Another embodiment of the invention to reduce write switching time includes a multi phase write pulse sequence including a multitude of pulses alternating between overdrive write pulses and lower current write pulses, for a respective predetermined length of time, and for a predetermined number of total pulses. This embodied method are called a "periodic" pulse. One embodiment the periodic pulse includes a multitude of overdrive pulses and at least one lower current pulse which shall be called a "periodic leading high" write pulse. In another embodiment the periodic pulse includes a multitude of lower current pulses and at least one overdrive pulse which shall be called a "periodic leading low" write pulse. Either periodic leading high or low write pulse embodiments may be accomplished with the circuits described above in the embodiments of FIGS. 7 through 9.

Figure 12:
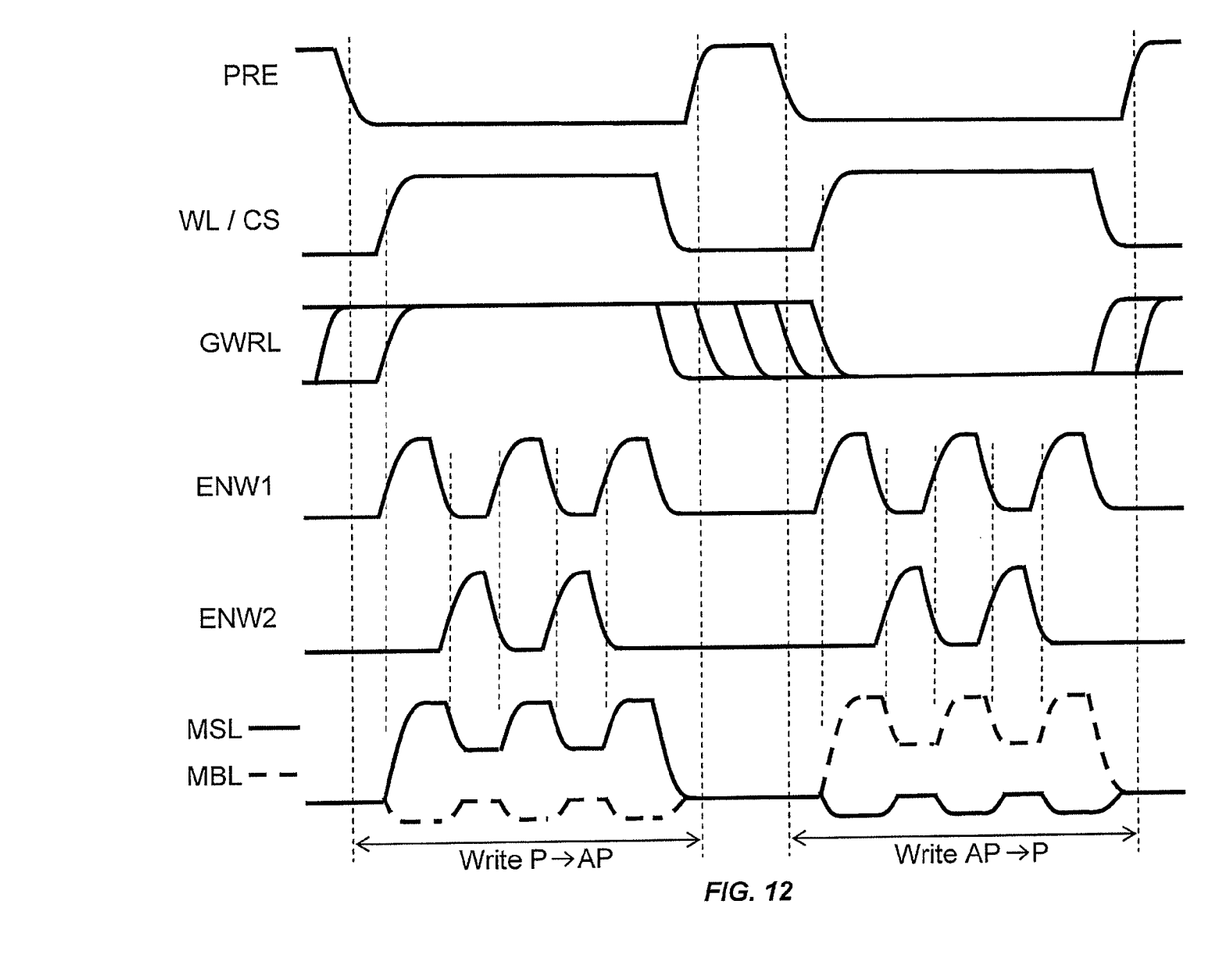
FIG. 12 is a third timing diagram of a number of signals used during write operation of the MRAM array of FIG. 6, in accordance with one exemplary embodiment of the present invention.

FIG. 12 is a periodic leading high pulse timing diagram of the voltage signals at nodes PRE, WL, CS, GWRL, ENW1, ENW2, MSL, and MBL of portions of MRAM 100 and associated writing circuitry of FIG. 7 and FIG. 9 during a write "1" or "P to AP" followed by a write "0" or "AP to P" operation method, in accordance with one exemplary embodiment of the present invention. The embodiment in FIG. 12 utilizes the same circuit topology and supply value relationships as were described in FIG. 10. The operation in FIG. 12 is analogous to FIG. 10 and will not be described in detail because their structures and operations are similar except as noted below. The difference between FIG. 10 and FIG. 12 includes additionally asserting ENW1 again after deasserting ENW2 during the second phase, followed by deasserting ENW1 after a predetermined time completing a third phase writing pulse, then asserting ENW2 after deasserting ENW1, followed by deasserting ENW2 after a predetermined time completing a fourth phase writing pulse, then asserting ENW1 after deasserting ENW2, and deasserting ENW1 after a predetermined time completing a fifth phase writing pulse. In other words, this embodiment includes five alternating write pulses starting with an overdrive writing pulse. Another embodiment (not shown) includes the periodic leading low writing pulse which includes five alternating write pulses starting with the lower than overdrive current writing pulse. Other embodiments comprising different number of total write pulses could be envisioned by persons of ordinary skill in the art and should not be construed as limiting the invention to the embodiments described herein.

Figure 13:
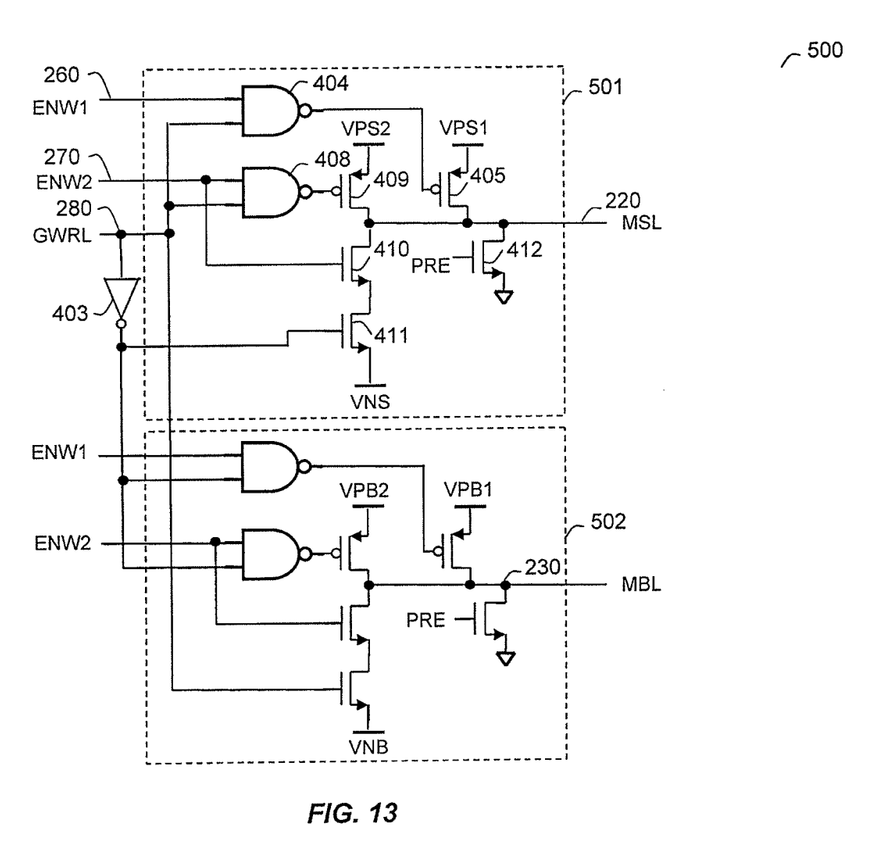
FIG. 13 is a schematic diagram of a simplified multi-supply local write circuit in accordance with another exemplary embodiment of the present invention.

FIG. 13 is a schematic diagram of a simplified multi-supply local write circuit 500 in accordance with another exemplary embodiment of the present invention. Multi-supply local write circuit 500 corresponds to local write circuit 250 which drives the MBL and MSL line pair under control of ENW1, ENW2 and GWRL as shown in FIG. 7. Referring to FIG. 13, simplified multi-supply local write circuit 500 includes the same elements and reference numbering as multi-supply local write circuit 400 shown in FIG. 9 with the following exceptions. Transistors 406 and 407 shown in FIG. 9 have been eliminated in FIG. 13. Also, supply voltages VNS1, VNS2 have been combined to a single supply, VNS, and supply voltages VNB1, VNB2 have been combined to a single supply, VNB. Thus multi-supply drive circuit 501 (corresponding to circuit 401 in FIG. 9) is adapted to drive the MSL line negative to one available supply voltage, VNS in FIG. 13, and multi-supply drive circuit 502 (corresponding to circuit 402 in FIG. 9) is adapted to drive the MSL line negative to one available supply voltage, VNB, in FIG. 13.

The operation of simplified multi-supply write circuit 501 is analogous to the operation of multi-supply drive circuit 300 described above in FIG. 8. The write mode operation of FIG. 13 is identical to the operation of FIG. 9 for driving MBL or MSL to the positive supplies since the circuit topology is identical with respect to the p-channel transistors and their driving circuits. Referring to FIG. 13, when ENW2 is asserted, n-channel transistors 410 in both circuits 501 and 502 are on, and negative supplies are controlled by n-channel transistors 411. Transistor 411, driven by the inverted GWRL signal through inverter 403 in circuit 501, then couples MSL to VNS whenever GWRL is logic low (i.e. when writing AP to P). Transistor 411, driven by the GWRL signal in circuit 502, couples MBL to VNB whenever GWRL is logic high (i.e. when writing P to AP). The simplified multi-supply local write circuit 500 takes less area on chip than the multi-supply local write circuit 400 shown in FIG. 9 but may still accomplish the embodiments described above with the following differences.

The sequencing for negatively driving MBL or MSL is more restricted in the embodiment described in FIG. 13 compared to the embodiment described in FIG. 9 since the circuit topology is not as symmetric with respect to driving the n-channel transistors 410 and 411. The embodiment of FIG. 13 works better for ENW2 preceding ENW1 as shown in the timing diagram in FIG. 11 for the following reasons. As shown in FIG. 13, n-channel transistor 410 in both simplified multi-supply write circuits 501 and 502 are connected to ENW2. Therefore, when ENW2 is deasserted, (i.e. when non-overlapping signal ENW1 is asserted), the negative supply paths are disconnected for MBL during a write P to AP and for MSL during a write AP to P operation. Thus, ENW2 should be asserted before ENW1 (as shown in FIG. 11) so that the MBL and MSL lines are driven to VNB and VNS respectively at the first phase of a write cycle and then allowed to float during the second phase. In the second phase, current flow from the negative supply direction through the selected cell would come from the virtual supply of stored capacitive charge on the MBL and MSL lines. As the charge on the MBL and MSL lines begin to deplete, the VNB and VNS voltages set during the first phase will start to rise during the second phase of the write P to AP and write AP to P operations respectively. This favors using a leading high write pulse method if longer second phase pulse length is desired or appropriate design of the available second phase pulse length with respect to how much voltage rise may be tolerated.

In one embodiment of this invention, the supply voltages VP1, VP2, VPX, VN1, VN2, and VNX shown in FIG. 8 and VPS1, VNB1, VPS2, VNB2, VPB1, VNS1, VPB2 and VNS2 (shown in FIGS. 9 through 11 and in part in FIG. 13) may be different values to provide better performance and power savings by supplying enough energy to overcome the inherent MRAM cell program "1"/program "0" writing energy mismatch. In other embodiments, some of the supply voltages VP1, VP2, VPX, VN1, VN2, and VNX and VPS1, VNB1, VPS2, VNB2, VPB1, VNS1, VPB2 and VNS2 may be made equal to reduce circuit area and complexity or provide a more efficient memory implementation while still providing a satisfactory performance tradeoff. For example, VNB2 and VNS2 may be made equal to ground potential voltage, VPS2 and VPB2 may be made equal to a digital supply Vcc voltage, VNB1 and VNS1 may be made equal to a negative internally pumped Vbb voltage, and VPS1 and VPB1 may be made equal to a positive internally pumped Vpp voltage. In other embodiments some or all of the supply voltages may be internally pumped while in other embodiments some or all of the supply voltages may be externally supplied. The invention is not limited to these embodiments since other combinations and sources of supply voltages could be made by persons of ordinary skill in the art.

In one embodiment of this invention, the predetermined time intervals tPSA, tPPA, tPSB and tPPB (shown in FIGS. 10 through 11) may be different values to provide better performance and power savings by supplying enough energy to overcome the inherent MRAM cell program "1"/program "0" writing energy mismatch. In other embodiments, some of the time intervals tPSA, tPPA, tPSB and tPPB may be made equal to each other to reduce control circuit 330 (FIG. 8) area and complexity or provide a more efficient memory implementation while still providing a satisfactory performance tradeoff. For example, tPSA may be made equal to tPSB while tPPA may be made equal to tPPB. In the periodic multi phase write pulse sequence (timing shown in FIG. 12), the ENW1 and ENW2 pulse lengths may be different or the same or they may be increasing or decreasing with each subsequent writing phase. The invention is not limited to these embodiments since other combinations of timing intervals could be made by persons of ordinary skill in the art.

The above embodiments of the present invention are illustrative and not limitative. Various alternatives and equivalents are possible. The embodiments of the present invention are not limited by the type or the number of the magnetic random access memory cells included in a memory array. The embodiments of the present invention are not limited by the number of layers included to form a magnetic tunnel junction. The embodiments of the present invention are not limited by the voltage levels applied to the magnetic memory cells. Nor are the embodiments of the present invention limited by the write driver circuit included to vary the terminal voltages of the select transistor during write cycles. The embodiments of the present invention are not limited by the type of transistor, PMOS, NMOS or otherwise, included to select a magnetic tunnel junction device. The embodiments of the present invention are not limited by the type of integrated circuit in which the present invention may be disposed. Nor are the embodiments of the present invention limited to any specific type of process technology, e.g., CMOS, Bipolar, or BICMOS that may be included to manufacture a magnetic random access memory. The embodiments described herein have been directed to MRAM memory writing circuits but are not limited thereto. The embodiments described herein may be included wherever a symmetric set of pulses may be found useful.

What is claimed is:

1. A method of driving a first supply line and a second supply line associated with a magnetic random access memory (MRAM), the method comprising:
supplying at least a first voltage having a first magnitude during at least a first time period and at least a second voltage having a second magnitude different from the first magnitude during at least a second time period on the first supply line; and
supplying at least a third voltage having a third magnitude different from the first and second magnitudes during at least the first time period and at least a fourth voltage having a fourth magnitude different from the first, second and third magnitudes during at least the second time period on the second supply line,
wherein the first voltage magnitude is higher than the third voltage magnitude, and the second voltage magnitude is higher than the fourth voltage magnitude.

2. The method of claim 1 further comprising:
supplying at least a fifth voltage having a fifth magnitude during at least a third time period and at least a sixth voltage having a sixth magnitude different from the fifth magnitude during at least a fourth time period on the first supply line, and
supplying at least a seventh voltage having a seventh magnitude different from the fifth and sixth magnitude during at least the third time period and at least an eighth voltage level having an eighth magnitude different from the fifth, sixth and seventh magnitude during at least the fourth time period on the second supply line.

3. The method of claim 1 further comprising:
supplying a ground voltage during at least a third time period on the first supply line, and
supplying a ground voltage during at least the third time period on the second supply line.

4. The method of claim 1 further comprising:
supplying at least the first voltage during at least a third time period on the first supply line, and
supplying at least the third voltage during at least the third time period on the second supply line.

5. The method of claim 2 wherein the seventh voltage magnitude is higher than the fifth voltage magnitude, and the eighth voltage magnitude is higher than the sixth voltage magnitude.

6. The method of claim 4 further comprising:
supplying at least a fifth voltage having a fifth magnitude during at least a fourth time period, at least a sixth voltage having a sixth magnitude different from the fifth magnitude during at least a fifth time period, and supplying at least the fifth voltage having the fifth magnitude during at least a sixth time period on the first supply line, and
supplying at least a seventh voltage having a seventh magnitude different from the fifth and sixth magnitudes during at least the fourth time period, at least an eighth voltage having an eighth magnitude different from the fifth, sixth and seventh magnitudes during at least the fifth time period, and at least the seventh voltage having the seventh magnitude during at least the sixth time period on the second supply line.

7. The method of claim 1 wherein the first voltage magnitude is higher than the second voltage magnitude.

8. The method of claim 1 wherein the first voltage magnitude is lower than the second voltage magnitude.

9. The method of claim 5 wherein the seventh voltage magnitude is higher than the eighth voltage magnitude.

10. The method of claim 5 wherein the seventh voltage magnitude is lower than the eighth voltage magnitude.

* * * * *